US012610668B2

(12) United States Patent
Mun et al.

(10) Patent No.: US 12,610,668 B2
(45) Date of Patent: Apr. 21, 2026

(54) COLOR CONVERTER LAYER AND MANUFACTURING METHOD THEREOF

(71) Applicant: Samsung Electronics Co., Ltd., Suwon-si (KR)

(72) Inventors: Ilju Mun, Suwon-si (KR); Keon Kuk, Suwon-si (KR); Jinwoo Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 916 days.

(21) Appl. No.: 17/735,567

(22) Filed: May 3, 2022

(65) Prior Publication Data

US 2022/0285590 A1 Sep. 8, 2022

Related U.S. Application Data

(63) Continuation of application No. PCT/KR2022/003061, filed on Mar. 4, 2022.

(30) Foreign Application Priority Data

Mar. 8, 2021 (KR) ......................... 10-2021-0029979

(51) Int. Cl.
*H10H 20/851* (2025.01)
*H10H 20/01* (2025.01)
*H10H 29/14* (2025.01)

(52) U.S. Cl.
CPC ........ *H10H 20/8514* (2025.01); *H10H 20/01* (2025.01); *H10H 29/142* (2025.01); *H10H 20/0361* (2025.01)

(58) Field of Classification Search
CPC .. H10H 29/142; H10H 20/01; H10H 20/0361; H10H 20/8514; H10H 20/8515;
(Continued)

(56) References Cited

U.S. PATENT DOCUMENTS 8,044,575 B2 10/2011 Kawamura
9,547,195 B2 1/2017 Guo et al.
(Continued)

FOREIGN PATENT DOCUMENTS

EP 3 872 539 A1 9/2021
JP 2007-256357 A 10/2007
(Continued)

OTHER PUBLICATIONS

International Search Report dated Jun. 29, 2022, issued in International Application No. PCT/KR2022/003061.
(Continued)

*Primary Examiner* — Mark W Tornow
*Assistant Examiner* — Priya M Rampersaud
(74) *Attorney, Agent, or Firm* — Jefferson IP Law, LLP

(57) ABSTRACT

A color converter layer is provided. The color converter layer includes a first light blocking member in which a plurality of pixel regions comprising a first pixel region and a second pixel region are disposed to be spaced apart from each other, a first color converter disposed in the first pixel region for converting and emitting incident light into a first color, a second color converter disposed in the second pixel region for converting and emitting the incident light into a second color different from the first color, and a second light blocking member that extends with a preset thickness and is formed on a surface of the first light blocking member, and blocks transmission of the incident light into an adjacent pixel region by partitioning the first pixel region and the second pixel region. The preset thickness may be greater than the thickness of the first light blocking member.

19 Claims, 20 Drawing Sheets

(58) Field of Classification Search

CPC .............. H10H 20/853; H10H 20/855; H10H 20/8513; H10H 20/8512; H10H 20/8511; H10H 20/851; H10H 29/012; H10H 29/0361; H10H 29/0363; H10H 29/30; H10H 29/8513; H10H 29/8514; H10H 29/8515; H10H 29/855; H10H 29/8552; H10H 20/854; H10H 20/882; H10H 20/0362; H10H 20/8506; H10H 20/8516; H10H 20/0363; H10H 20/036; H10H 20/852; H10H 29/8517; H10H 29/37; H10H 29/8512; H10H 29/34; H01L 25/0753; H01L 25/167; H01L 25/13; H01L 2924/12041; G02B 5/20; G02B 5/22; G02B 5/26; G02B 5/003; G02B 5/0242; H10K 59/35; H10K 59/38; H10K 50/865; H10K 59/8792; H10K 59/122; H10K 59/126; H10K 59/352; H10K 59/12; G02F 1/133514; G02F 1/133614; G02F 2202/36; G02F 2202/108; G02F 1/01791; G02F 2201/123; G02F 1/133603; G02F 1/133621; G02F 1/134309; G02F 1/133512; G03F 7/0007; G09G 2300/0452; H05B 33/145

See application file for complete search history.

(56) References Cited

U.S. PATENT DOCUMENTS

| | | | |
|---|---|---|---|
| 9,971,198 B2 | 5/2018 | Cho et al. | |
| 10,114,247 B2 | 10/2018 | Lee | |
| 10,185,066 B2 | 1/2019 | Chae et al. | |
| 10,228,586 B2 | 3/2019 | Chae et al. | |
| 10,365,509 B2 | 7/2019 | Jeon et al. | |
| 11,092,841 B2 | 8/2021 | Baek et al. | |
| 11,626,453 B2 | 4/2023 | Kim et al. | |
| 2005/0180721 A1* | 8/2005 | Hayashi | H10K 59/873 |
| | | | 385/147 |

| | | | |
|---|---|---|---|
| 2011/0062859 A1 | 3/2011 | Kawamura | |
| 2012/0268700 A1 | 10/2012 | Shu et al. | |
| 2018/0031759 A1* | 2/2018 | Kong | G02B 6/0023 |
| 2018/0045866 A1 | 2/2018 | Chae et al. | |
| 2018/0088404 A1 | 3/2018 | Chae et al. | |
| 2018/0351054 A1* | 12/2018 | Chen | H10H 20/8506 |
| 2019/0025634 A1* | 1/2019 | Park | G02F 1/133377 |
| 2019/0237637 A1 | 8/2019 | Cheng et al. | |
| 2019/0310522 A1* | 10/2019 | Chu | G02F 1/133617 |
| 2020/0066803 A1 | 2/2020 | Kim et al. | |
| 2020/0089047 A1* | 3/2020 | Baek | G02F 1/133512 |
| 2020/0328256 A1* | 10/2020 | Lee | H10K 59/8051 |
| 2020/0343315 A1* | 10/2020 | Lin | H10K 59/80522 |
| 2021/0005672 A1* | 1/2021 | Lee | G02B 5/201 |
| 2021/0111164 A1* | 4/2021 | Chen | H01L 25/13 |
| 2021/0138794 A1* | 5/2021 | Chen | B41J 2/1433 |
| 2021/0143222 A1* | 5/2021 | Song | H10K 59/353 |
| 2021/0151702 A1* | 5/2021 | Fan | H10K 59/878 |
| 2021/0351238 A1 | 11/2021 | Park et al. | |
| 2021/0351239 A1 | 11/2021 | Bae et al. | |

FOREIGN PATENT DOCUMENTS

| | | |
|---|---|---|
| JP | 2015-128027 A | 7/2015 |
| KR | 10-2010-0114101 A | 10/2010 |
| KR | 10-2012-0049486 A | 5/2012 |
| KR | 10-2018-0018945 A | 2/2018 |
| KR | 10-2018-0035286 A | 4/2018 |
| KR | 10-2020-0023964 A | 3/2020 |
| KR | 10-2020-0031750 A | 3/2020 |
| KR | 10-2021-0137810 A | 11/2021 |
| WO | 2020/085606 A1 | 4/2020 |

OTHER PUBLICATIONS

Written Opinion dated Jun. 29, 2022, issued in International Application No. PCT/KR2022/003061.
European Search Report dated Mar. 18, 2024, issued in European Application No. 22767408.2.
Korean Office Action dated Aug. 28, 2025, issued in a Korean Patent Application No. 10-2021-0029979.

* cited by examiner

100

COLOR CONVERTER LAYER AND MANUFACTURING METHOD THEREOF

CROSS-REFERENCE TO RELATED APPLICATION(S)

This application is a continuation application, claiming priority under § 365(c), of an International application No. PCT/KR2022/003061, filed on Mar. 4, 2022, which is based on and claims the benefit of a Korean patent application number 10-2021-0029979, filed on Mar. 8, 2021, in the Korean Intellectual Property Office, the disclosure of which is incorporated by reference herein in its entirety.

BACKGROUND

1. Field

The disclosure relates to a color converter layer and a manufacturing method thereof. More particularly, the disclosure relates to a color converter layer including a light-blocking member and a manufacturing method thereof.

2. Description of Related Art

A color converter layer is a component of a display apparatus and is also referred to as a color film or a color filter, and a display apparatus displays a color image through a method in which incident light emitted from a light source of the display apparatus passes through the color converter layer and is converted to one of red, green, or blue colors, and implements a pixel.

Research and development have been performed on a display apparatus with improved brightness, resolution, and color expression of a display screen according to the advancement of technology, and there is a technical need for a color converter layer structure capable of realizing a clear color by preventing a light leakage to an adjacent sub-pixel and improving a color gamut and a contrast ratio, and a method for manufacturing the same.

The above information is presented as background information only to assist with an understanding of the disclosure. No determination has been made, and no assertion is made, as to whether any of the above might be applicable as prior art with regard to the disclosure.

SUMMARY

In the related-art color converter layer, as the incident light passes through a color conversion unit, the amount of light is reduced, light efficiency is lowered, and brightness improvement has limitation and thus, configuring a color converter layer based on quantum dot enhancement film (QDEF) using quantum dot (QD) light emission is used.

The thickness of the color converter layer is defined by a black matrix made of a light blocking member, but there is a problem in securing the thickness of the color converter layer due to an implementation limit of the thickness of the black matrix, and there is a problem in that light leakage phenomenon between adjacent pixel regions may occur by a space formed between a plurality of light sources and the color converter layer.

Aspects of the disclosure are to address at least the above-mentioned problems and/or disadvantages and to provide at least the advantages described below. Accordingly, an aspect of the disclosure is to provide a color converter layer and a manufacturing method thereof to secure thickness through a light blocking member and prevent light leakage phenomenon.

Additional aspects will be set forth in part in the description which follows and, in part, will be apparent from the description, or may be learned by practice of the presented embodiments.

In accordance with an aspect of the disclosure, a color converter layer is provided. The color converter layer includes a first light blocking member in which a plurality of pixel regions comprising a first pixel region and a second pixel region are disposed to be spaced apart from each other, a first color converter disposed in the first pixel region and configured to convert incident light into a first color and emit the incident light in the first color, a second color converter disposed in the second pixel region and configured to convert the incident light into a second color that is different from the first color, and to emit the incident light in the second color, and a second light blocking member that extends with a preset thickness and is formed on a surface of the first light blocking member, and is configured to block transmission of the incident light into an adjacent pixel region by partitioning the first pixel region and the second pixel region, wherein the preset thickness of the second light blocking member is greater than the thickness of the first light blocking member.

The plurality of pixel regions may comprise a plurality of first pixel regions arranged in a column direction in a matrix structure, and a second pixel region arranged in a column direction adjacent to a row direction of the plurality of first pixel regions.

The second light blocking member may include a first region configured to partition the plurality of pixel regions in a column direction of the matrix structure and a second region configured to partition the plurality of pixel regions in a row direction of the matrix structure, and the first region may have the preset thickness.

A second region of the second light blocking member may have a thickness less than or equal to the preset thickness of the first region.

The first region of the second light blocking member may have an area less than or equal to a facing area of the first light blocking member.

The second region of the second light blocking member may have an area less than or equal to a facing area of the first light blocking member.

At least a part of an area of a surface of the second light blocking member that is parallel to the one surface of the first light blocking member may be ink-phobic.

The color converter layer may include an intermediate layer provided between the first light blocking member and the second light blocking member, and the intermediate layer may have thickness less than or equal to the preset thickness of the second light blocking member.

The intermediate layer may have an area less than or equal to an area of a facing region of the first light blocking member, and the second light blocking member may have an area less than or equal to an area of a facing region of the intermediate layer.

The intermediate layer may be formed of a plurality of layers.

The second light blocking member may be disposed to be spaced apart from the one surface of the first light blocking member, and may include an adhesive layer filling between the first light blocking member and the second light blocking member.

The color converter layer may include an optical resin disposed on the first pixel region partitioned by the second light blocking member and at least a part is curved in a direction of the first light blocking member.

The first light blocking member may include a third pixel region disposed to be spaced apart from the first pixel region and the second pixel region, and may include a transmission layer disposed on the third pixel region to transmit the incident light.

In accordance with another aspect of the disclosure, a method of manufacturing a color converter layer is provided. The method includes patterning and forming, on a substrate, a first light blocking member that defines a plurality of pixel regions in a matrix format, patterning and forming a second light blocking member that extends with a preset thickness greater than a thickness of the first light blocking member on a surface of the first light blocking member and partitions a column direction of the plurality of pixel regions, applying a first color converter that converts incident light into a first color between the second light blocking members in a column direction of the plurality of pixel regions, and applying a second color converter that converts the incident light into a second color that is different from the first color to be adjacent with the first color converter, in a column direction of the plurality of pixel regions.

The applying the first color converter may include controlling electronic field of a dispenser nozzle and applying the first color converter in a dispensing manner.

The applying the first color converter may include applying the first color converter continuously and linearly in the column direction.

The forming the second light blocking member may include patterning may be performed so that the first region for partitioning the column direction of the plurality of pixel regions and the second region for partitioning the row direction of the plurality of pixel regions are formed on the one surface of the first light blocking member.

The forming the second light blocking member may include patterning so that the first region has thickness less than or equal to the preset thickness of the first region.

The forming the second light blocking member may include patterning so that at least a part of a region of the second light blocking member has an area less than or equal to a facing region of the first light blocking member.

In the forming the second light blocking, at least a part of the region of the second light blocking member may be ink-phobic.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

Figure 1:
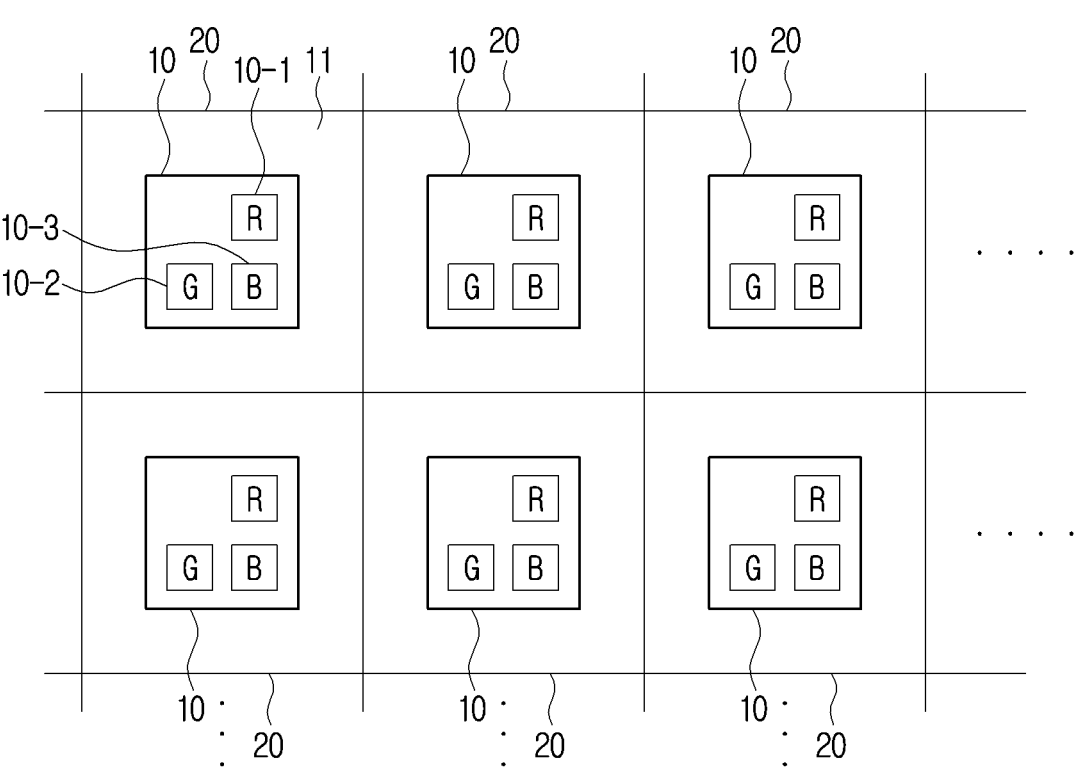
FIG. 1 is a diagram illustrating a pixel structure of a display apparatus according to an embodiment of the disclosure.

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

One or more specific embodiments of the disclosure are illustrated in the drawings and are described in detail in the detailed description. However, it is to be understood that the disclosure is not limited to the one or more specific embodiments, but includes all modifications, equivalents, and substitutions without departing from the scope and spirit of the disclosure. Also, well-known functions or constructions are not described in detail since they would obscure the disclosure with unnecessary detail.

The expressions "first", "second", "third" or the like, used in the disclosure may indicate various components, but do not limit the corresponding components. The expressions will be used only in order to distinguish one component from the other components. For example, the first component may be named the second component and the second component may also be similarly named the first component, without departing from the scope of the disclosure.

It is to be understood that terms such as "comprise" or "consist of" are used herein to designate a presence of a characteristic, number, step, operation, element, component, or a combination thereof, and not to preclude a presence or a possibility of adding one or more of other characteristics, numbers, steps, operations, elements, components or a combination thereof Terms such as "module," "unit," "part," and so on are used to refer to an element that performs at least one function or operation, and such element may be implemented as hardware or software, or a combination of hardware and software. Further, except for when each of a plurality of "modules," "units," "parts," and the like needs to be realized in an individual hardware, the components may be integrated in at least one module or chip and be realized in at least one processor.

Embodiments of the disclosure will be described in detail with reference to the accompanying drawings to aid in the understanding of those of ordinary skill in the art. However, the disclosure may be realized in various different forms and it should be noted that the disclosure is not limited to the various embodiments described herein. Further, in the drawings, parts not relevant to the description may be omitted, and like reference numerals may be used to indicate like elements.

Further, the embodiments have been described in detail below with reference to the accompanied drawings and the descriptions to the accompanied drawings, but it should be understood that the disclosure is not limited by the embodiments.

Hereinafter, with reference to FIGS. 1 to 4, 5A to 5C, 6A to 6C, 7, 8A, and 8B, a display panel and a display device will be described in detail.

FIG. 1 is a diagram illustrating a pixel structure of a display apparatus 100 according to an embodiment of the disclosure.

Referring to FIG. 1, the display apparatus 100 may include a plurality of pixels 10 arranged in a matrix form.

The display apparatus 100 may be configured in a single unit, and may be installed in an electronic product or electric field such as a wearable device, a portable device, a handheld device, a mobile device requiring various displays, a wireless communication device, or the like. The display apparatus 100 may be implemented as a television (TV), or any device having a display function such as a video wall, a large format display (LFD), a digital signage, a digital information display (DID), a projector display, and the like. The display apparatus 100 may be applied to various display apparatuses 100, such as a monitor for a personal computer (PC), a high-resolution TV, and a signage (or digital signage), and an electronic display, through a plurality of assembly arrangements in which a plurality of display modules are implemented in a matrix type.

The display apparatus 100 may include a plurality of pixels 10 arranged in a matrix form, and one pixel 10 may include a plurality of pixel regions 10-1 to 10-3, each of which corresponds to a sub-pixel. For example, each of the plurality of pixels 10 may include a plurality of pixel regions 10-1 to 10-3 including a first pixel region 10-1 which is a red (R) sub-pixel, a second pixel region 10-2 which is a green (G) sub-pixel, and a third pixel region 10-3 which is a blue (B) sub-pixel. The pixel regions 10-1 to 10-3 composed of R, G, and B sub-pixels may constitute one unit pixel 10 of the display apparatus 100 in one set.

In general, the arrangement order of a plurality of pixel regions 10-1 to 10-3 is R, G, B, but not actually arranged in the order of R, G, B in the pixel 10, and in this disclosure, the reference numerals are described in the order of R, B, and G in the description of a plurality of pixel regions 10-1 to 10-3, and the order is for convenience of description. The order of arrangement of light emitting devices and driving circuits may be the same or different.

In the display apparatus 100, one pixel region 20 may include a region occupied by a pixel 10 consisting of a plurality of pixel regions 10-1 to 10-3 and a remaining region 11 around the pixel region 20. The area occupied by the pixel 10 may be divided into the area consisting of pixel regions 10-1 to 10-3 which are R, G, B sub-pixels and the remaining area 11. According to various embodiments, the remaining area 11 around the area occupied by the pixel 10 may include another driving circuit (not shown) for driving the plurality of light sources 115, and a light blocking member 150 may be disposed in the display direction of the display apparatus 100.

Figure 3:
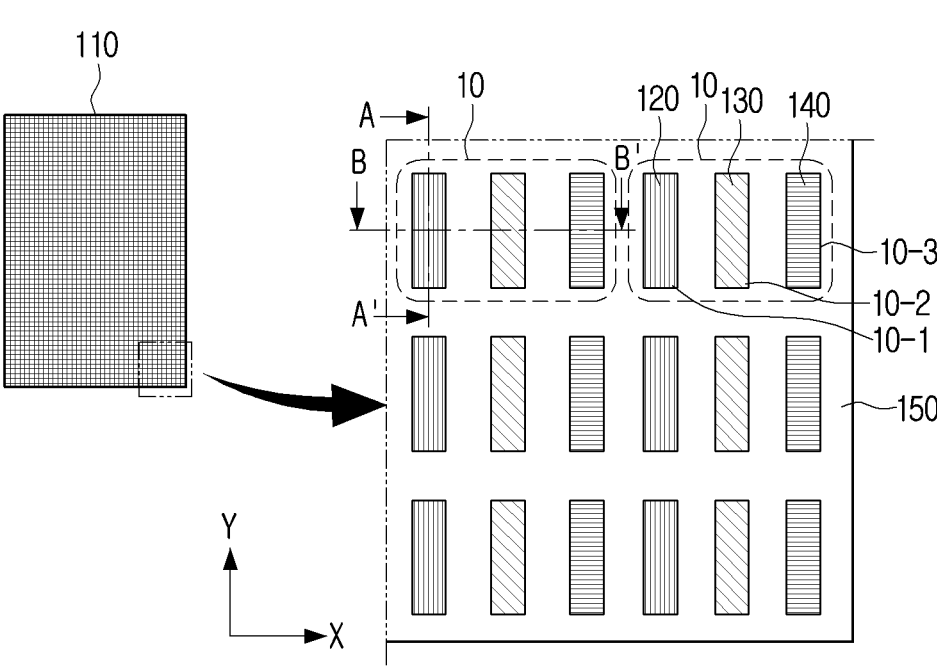
FIG. 3 is a diagram illustrating a color converter layer according to an embodiment of the disclosure.

Referring to FIG. 1, the plurality of pixel regions 10-1 to 10-3 in one pixel 10 are shown to be arranged in the L-shape where left and right are reversed, but embodiments of the disclosure are not limited thereto, and as shown in FIG. 3, the R, G, and B pixel regions 10-1 to 10-3 may be arranged in a row inside the pixel 10, or the plurality of pixel regions 10-1 to 10-3 may be arranged in various forms within each pixel 10.

In the above-described example, the pixel 10 includes three sub-pixels 10-1 to 10-3, but the pixel 10 may be implemented as four sub-pixels, such as R, G, B, and white (W), or a different number of sub-pixels may constitute one pixel. For convenience of description, an example in which the pixel 10 is composed of three types of sub-pixels, such as R, G, and B, will be described.

Figure 2:
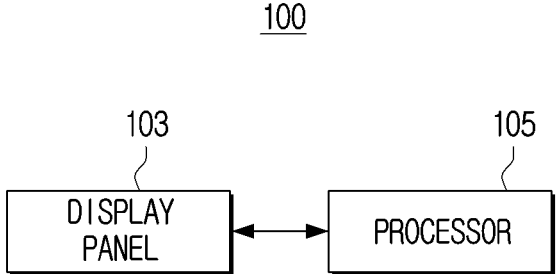
FIG. 2 is a block diagram illustrating a display apparatus according to an embodiment of the disclosure.

FIG. 2 is a block diagram illustrating the display apparatus 100 according to an embodiment of the disclosure.

Referring to FIG. 2, the display apparatus 100 according to an embodiment may include a display panel 103 and a processor 105.

The display panel 103 may be implemented with various types of displays such as a liquid crystal display (LCD), quantum dot (QD) display panel, organic light emitting diodes (OLED) display, liquid crystal on silicon (LCoS), digital light processing (DLP), quantum dot light-emitting diodes (QLED), micro light-emitting diodes (µLED), mini LED, or the like. The display panel 103 may be implemented as a touch screen coupled to a touch sensor, a flexible display, a rollable display, a three-dimensional (3D) display, a display in which a plurality of display modules are physically connected, or the like.

The display apparatus 100 may display various images. The image may include a still image and a moving image (video), and the display apparatus 100 may display various images, such as broadcast content, multimedia content, and the like. The display apparatus 100 may display a user interface (UI) and an icon.

The display panel 103 may include an integrated circuit (IC) chip, and the IC chip may display an image based on an image signal received from the processor 105. For example, the IC chip may generate a driving signal of the plurality of light sources 115 based on an image signal received from the processor 105, and display an image by controlling light emission of a plurality of pixels included in the display panel 103 based on the driving signal.

The display panel 103 may include a driving circuit, a backlight unit, or the like, which may be implemented as a-si TFT, low temperature poly silicon (LTPS) TFT, organic TFT (OTFT), or the like.

The processor 105 controls the overall operation of the display apparatus 100. The processor 105 may include one or a plurality of processors. The processor 105 may perform an operation of the display apparatus 100 according to various embodiments of the disclosure by executing at least one instruction stored in the memory.

The processor 105 may be implemented with, for example, and without limitation, a digital signal processor (DSP) for image-processing of a digital image signal, a microprocessor, a graphics processor (GPU), an artificial intelligence (AI) processor, a neural processor (NPU), a time controller (TCON), or the like, but the processor is not limited thereto. The processor 105 may include, for example, and without limitation, one or more among a central processor (CPU), a micro processing unit (MPU), a controller, an application processor (AP), a communication processor (CP), an advanced reduced instruction set computing (RISC) machine (ARM) processor, or may be defined as a corresponding term. The processor 105 may be implemented in a system on chip (SoC) type or a large scale integration (LSI) type which a processing algorithm is built therein, application specific integrated circuit (ASIC), or in a field programmable gate array (FPGA) type.

The processor 105 may control hardware or software elements connected to the processor 105 by driving an operating system or an application program and may perform data processing or operation. The processor 105 may load instructions or data received from at least one of the elements in a volatile memory for processing and may store various data in a non-volatile memory.

FIG. 3 is a diagram illustrating a color converter layer according to an embodiment of the disclosure.

Referring to FIG. 3, the display panel 103 of the display apparatus 100 according to an embodiment may include a color converter layer 110 and may implement a plurality of pixels 10 through the color converter layer 110.

The plurality of pixels 10 may include a plurality of pixel regions 10-1 to 10-3, and each of the plurality of pixel regions 10-1 to 10-3 may emit light of one of a first color, a second color, or a third color that are different from each other to constitute a plurality of pixels 10. For example, each of the plurality of pixels 10 may include a first pixel region 10-1 constituting a first sub-pixel for emitting light of a first color, a second pixel region 10-2 constituting a second sub-pixel for irradiating light of a second color, or a third pixel region 10-3 constituting a third sub-pixel for irradiating light of a third color, and in one embodiment, the first pixel region 10-1 may be implemented as a red sub-pixel, a second pixel region 10-2 as a green sub-pixel, and a third pixel region 10-3 as a blue sub-pixel.

The plurality of pixel regions 10-1 to 10-3 may be variously implemented depending on the type of the display panel 103 and the type of the plurality of light sources 115. For example, each of the plurality of pixel regions 10-1 to 10-3 may include first to third color converters 120, 130, and 140 to convert the color of incident light incident from the light source 115 into a first color or a second color.

According another embodiment of the disclosure, in the plurality of pixel regions 10-1 to 10-3, each of the first pixel region 10-1 and a second pixel region 10-2 that are part of a plurality of pixel regions 10-1 to 10-3 may include a first color converter 120 and a second color converter 130, and a third pixel region 10-3, which is another part of the plurality of pixel regions 10-1 to 10-3, may not include a separate color converter. In this example, the third color of the third pixel region 10-3 of one embodiment may correspond to the color of emitted light of the light source 115. The color converter layer 110 including the plurality of color converters 120, 130, and 140 will be described in detail with reference to FIG. 4.

The plurality of pixels 10 may be arranged in a matrix form, and each of the plurality of pixel regions 10-1 to 10-3 may be arranged in a matrix form. The first to third pixel regions 10-1 to 10-3 included in one pixel 10 may be arranged in a matrix-shaped row direction (i.e., a horizontal direction or an X-axis direction), and each of the first to third pixel regions 10-1 to 10-3 may be arranged in a column direction (i.e., a vertical direction or a Y-axis direction) in a matrix form. According to another embodiment of the disclosure, although not shown in the drawings, each of the first to third pixel regions 10-1 to 10-3 included in one pixel 10 may be arranged in a row in a vertical direction.

Figure 4:
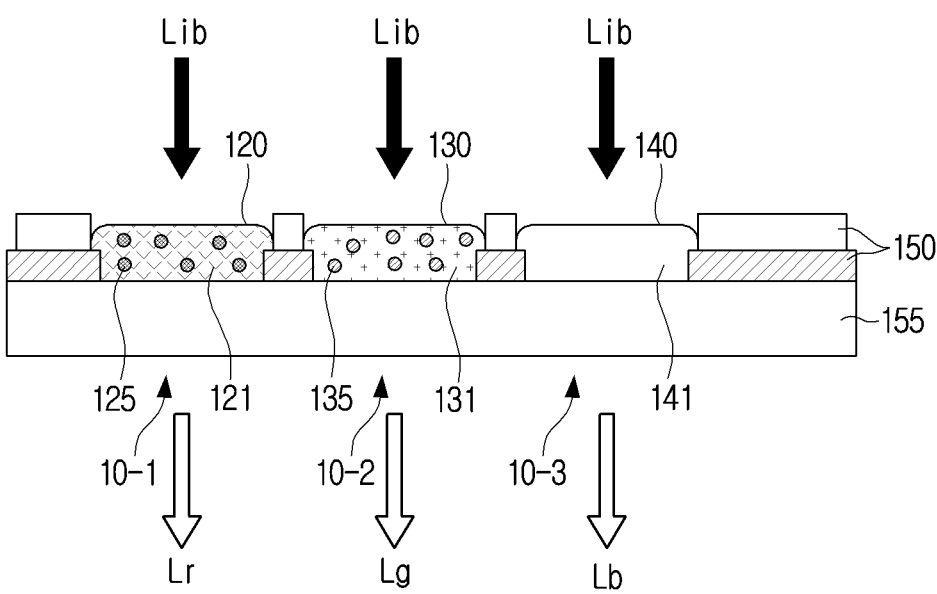
FIG. 4 is a cross-sectional diagram of a color converter layer according to an embodiment of the disclosure.

FIG. 4 is a cross-sectional diagram of a color converter layer 110 according to an embodiment of the disclosure. More specifically, FIG. 4 is a cross-sectional diagram with respect to a cross-sectional line of B-B' of FIG. 3.

Referring to FIG. 4, the color converters 120, 130 may include a photosensitive resin 121, 131 and quantum dots 125, 135.

The incident light Lib emitted by the plurality of light sources 115 may be incident light Lib having a blue wavelength, but is not limited thereto, and may be white light or ultraviolet light. The light Lr of the first color that has passed through the first color converter 120 may be red light, the second color light Lg of the second color passing through the second color converter 130 may be green light, and the third color light Lb having passed through a transmission layer 140 or the third color converter 145 (see FIG. 7) may be blue light. Therefore, a single color incident light Lib is emitted as red light, green light, and blue light through the color converter layer 110 and implemented as sub-pixels, respectively, and sub-pixels may be gathered to constitute one pixel 10.

Although not shown in the drawings, the color converters 120 and 130 and the transmission layer 140 may include scattering particles (not shown). The scattering particles (not shown) may scatter incident light Lib that has not been absorbed into quantum dots 125 and 135, and may excite more quantum dots 125 and 135 by the incident light Lib. Therefore, the color conversion rate of the color converter layer 110 may be improved by scattering particles (not shown).

The first color converter 120 may include a first quantum dot 125 and a first photosensitive resin 121 to convert incident light Lib into a first color, and may constitute a first pixel region 10-1. According to an embodiment of the disclosure, the first color may be red, and the first quantum dot 125 may be excited by an incident light Lib to emit a red light of the first color. Specifically, the first quantum dot 125 may absorb incident light Lib having a wavelength of blue light and may emit a first color light Lr having a wavelength longer than that of the incident light Lib in an isotropic manner. The first photosensitive resin 121 may be formed of a material having optical permeability, and may be formed of, for example, a silicon resin, an epoxy resin, an acrylate, a siloxane-based or an organic material having optical permeability.

The second color converter 130 may include the second quantum dot 135 and the second photosensitive resin 131 to convert the incident light Lib into a second color different from the first color, and may constitute the second pixel region 10-2. The second color may be green, and the second quantum dot 135 may be excited by the incident light Lib to emit the second color light Lg. The second quantum dot 135 may absorb incident light Lib having a wavelength of blue light, and emit green light of a second color having a wavelength longer than the incident light Lib in an isotropic manner. The size of the second quantum dot 135 in one embodiment may be smaller than the size of the first quantum dots 125. The second photosensitive resin 131 may be made of a material having optical permeability and may be made of the same material as the first photosensitive resin 121.

The color converter layer 110 may include the transmission layer 140 and transmit the incident light Lib to constitute the third pixel region 10-3. The transmission layer 140 may include a third photosensitive resin 141. The third color may be blue, and the transmission layer 140 may transmit and emit blue incident light Lib. The third photosensitive resin 141 may be made of a material having optical permeability and the same material as the first photosensitive resin 121 or the second photosensitive resin 131. Alternatively, the third pixel region 10-3 may be in the form of an empty space without the transmission layer 140 and the third photosensitive resin 141.

The color converter layer 110 of one embodiment may convert at least a portion of an incident light (Lib) consisting of blue light into red light and/or green light and transmit another portion thereof, constitute a plurality of pixel regions 10-1 to 10-3, and implement a plurality of pixels 10. In another embodiment, the color converter layer 110 may include a plurality of pixel regions 10-1 to 10-3 by color-converting at least a portion of an incident light Lib made of white light into red light, green light, and/or blue light, and may implement a plurality of pixels 10 of the display apparatus 100.

Figure 7:
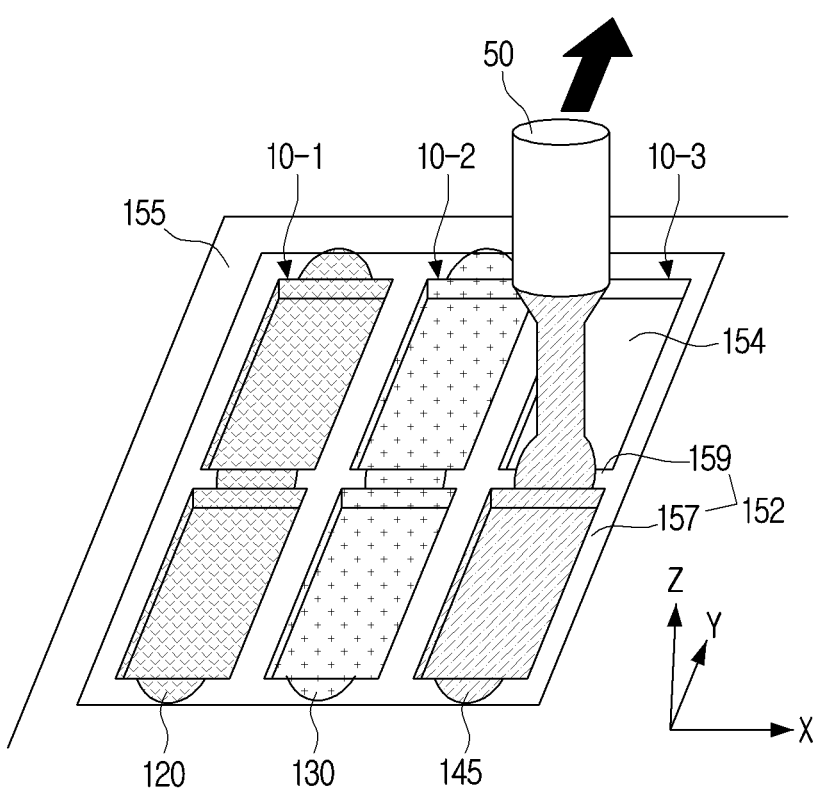
FIG. 7 is a diagram illustrating a method for manufacturing a color converter layer according to an embodiment of the disclosure.

Referring to FIG. 7, the color converter layer 110 may include a third color converter 145. The third color converter 145 may include a third photosensitive resin 141 and a third quantum dot (not shown). In this case, the incident light may be white light or ultraviolet light, and the third quantum dot (not shown) may absorb incident light and emit blue light, which is a third color light Lb having a wavelength longer than the incident light, to be emitted in an isotropic manner.

Figure 5A:
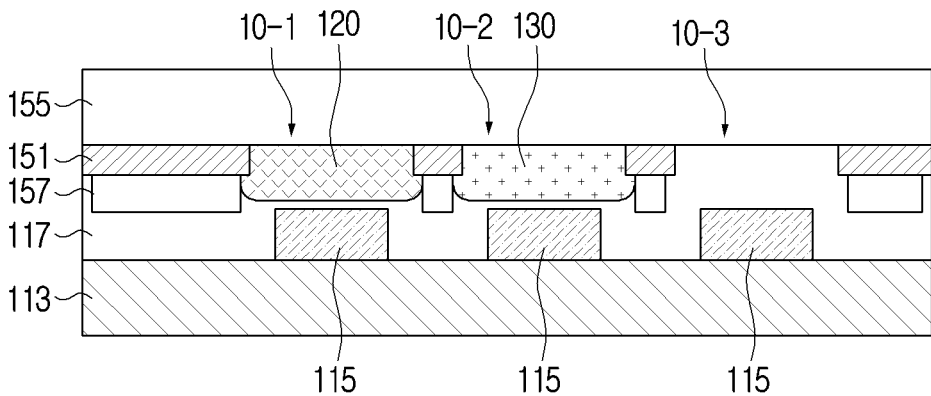
FIG. 5A is a cross-sectional diagram of a display apparatus according to an embodiment of the disclosure.

FIG. 5A is a cross-sectional diagram of a display apparatus 100 according to an embodiment of the disclosure.

Referring to FIG. 5A, the display apparatus 100 may include at least one of a base substrate 113, a plurality of light sources 115, an adhesion layer 117, a color converter layer 110, or a transparent substrate 155. The color converter layer 110 may include a light blocking member 150.

The display apparatus 100 may include a plurality of light sources 115 to correspond to a plurality of pixel regions 10-1 to 10-3. Alternatively, the display apparatus 100 may display a screen of the display apparatus 100 by emitting a quantum dot of the color converter layer 110 without including a separate light source 115, or may be provided with a backlight panel (not shown) to provide incident light. In describing the display apparatus 100, the plurality of light sources 115 may be disposed corresponding to the plurality of pixel regions 10-1 to 10-3, but embodiments of the disclosure are not limited thereto in the actual implementation of the color converter layer.

The plurality of light sources 115 may provide incident light for displaying an image of the display apparatus 100. The plurality of light sources 115 may be arranged in a matrix form and arranged to face the color converter layer 110 to emit incident light in a direction of the color converter layer 110. The incident light of the plurality of light sources 115 in various embodiments may be blue light or ultraviolet light.

The base substrate 113 may be a TFT substrate, and may be a glass, a metal, or an organic material. The base substrate 113 may be disposed with a driving circuit or a power supply line for controlling a plurality of light sources 115 disposed on an upper end, and may receive a signal by the processor 105 to control the plurality of light sources 115. The base substrate 113 may include a plurality of thin film transistors, and may include a gate wiring and a data wiring for applying a gate signal and a data signal, respectively.

The adhesive layer 117 may protect a plurality of light sources 115, and adhere the base 113 and the color converter layer 110. The adhesive layer 117 may be formed of an optical clear adhesive (OCA), optical adhesive film or optical clear resin (OCR).

The transparent substrate 155 is a substrate of a transparent material capable of passing light emitted from the color converter layer 110 and may be formed of an insulating material such as glass, plastic, or crystal, or may be a transparent film, and the transparent substrate 155 of the disclosure may be variously implemented without being limited thereto.

The color converter layer 110 may be disposed between the transparent substrate 155, the light source 115 and the adhesive layer 117. The color converter layer 110 may include a portion in which the color converters 120 and 130 are disposed to color-convert and emit at least a portion of the incident light. Other portions of the color converter layer 110 may transmit incident light through the transmission layer 140 or the adhesive layer 117, or may be disposed with the light blocking member 150 to block the transmission of incident light. The color converter layer 110 may divide a region where light is emitted and a region where light is blocked and may define a plurality of pixel regions 10-1 to 10-3.

The color converter layer 110 may be in a matrix format in which the first pixel region 10-1 where the first color converter 120 emitting the first color is disposed and the second pixel region 10-2 where the second color converter 130 emitting the second color may be disposed are spaced apart from each other to face the plurality of light sources 115, and the first light blocking member 151 may be disposed between the first pixel region 10-1 and the second pixel region 10-2. Alternatively, the first light blocking member 151 may include a partial region opened through the patterning process, and the first color converter 120 and the second color converter 130 may be spaced apart from each other in at least a portion of the opened region, and may be arranged in a matrix form. Therefore, the first light blocking member 151 may divide the first color converter 120 and the second color converter 130 and divide and define a plurality of pixel regions 10-1 to 10-3 including the first pixel region 10-1 and the second pixel region 10-2.

The color converter layer 110 of one embodiment may include a third pixel region 10-3 in which one of the transmission layer 140, the adhesive layer 117, or the third color converter 145 is positioned to emit a third color. The third pixel region 10-3 may be disposed in a matrix format in which the third pixel region 10-3 is spaced apart from the first pixel region 10-1 or the second pixel region 10-2 so as to face the plurality of light sources 115, and the first light blocking member 151 may be disposed between the first pixel region 10-1 or the second pixel region 10-2.

The first light blocking member 151 may be implemented as a black matrix (BM). The first light blocking member 151 may prevent incident light from being emitted in a direction of the transparent substrate 155, or may reflect the excitation light of the first color converter 120 or the second color converter 130 so that the excitation light of the first color converter 120 or the second color converter 130 is not emitted in the lateral direction.

The first light blocking member 151 may be implemented in a black color such that light is shielded other than the plurality of pixel regions 10-1 to 10-3 in the front direction of the display apparatus 100, that is, in the direction in which the screen is displayed. The first light-blocking member 151 may include an opaque inorganic insulating material, such as CrOx, MoOx or carbon black, or an opaque organic insulating material, such as a black resin. The first light blocking member 151 may improve the light efficiency of the display apparatus 100 and improve color reproducibility as the plurality of pixel regions 10-1 to 10-3 are spaced apart from each other to partition among the plurality of pixel regions 10-1 to 10-3.

The second light blocking member 152 may extend from one surface of the first light blocking member 151 in a direction of the plurality of light sources 115, and may block transmission of the incident light of the plurality of light sources 115 to another adjacent pixel region. The second light blocking member 152 may be a barrier wall structure that partitions between the plurality of light sources 115, or may be a bank structure disposed between the plurality of pixel regions 10-1 to 10-3 to block transmission of incident light.

The second light blocking member 152 may include a first region 157 and a second region 159 according to the direction of partitioning the plurality of light sources 115. FIG. 5A illustrates a first area 157, which is a partial area of the second light blocking member 152. The second light blocking member including the second area 159 will be described in detail with reference to FIG. 6B.

The first region 157 of the second light blocking member 152 may prevent the plurality of light sources 115 from leaking to the other pixel regions 10-1 to 10-3 other than the facing pixel regions 10-1 to 10-3 and may prevent light leakage between the first pixel region 10-1, the second pixel region 10-2, or the third pixel region 10-3.

The second light blocking member 152 may be whitish that reflects light, may be blackish that absorbs light, may be a grayish in which a black material is mixed, or may be formed of a metal material to reflect light, and the second light blocking member 152 of one embodiment may be made of a same material as the first light blocking member 151 and may be implemented as a single body.

The second light blocking member 152 may have a structure extending from one surface of the first light blocking member 151 with a predetermined thickness h2, and the predetermined thickness h2 may be the same as the thickness h1 of the first light blocking member 151 or greater than the thickness h1 of the first light blocking member 151, which will be described in detail with reference to FIG. 6A.

Figure 5B:
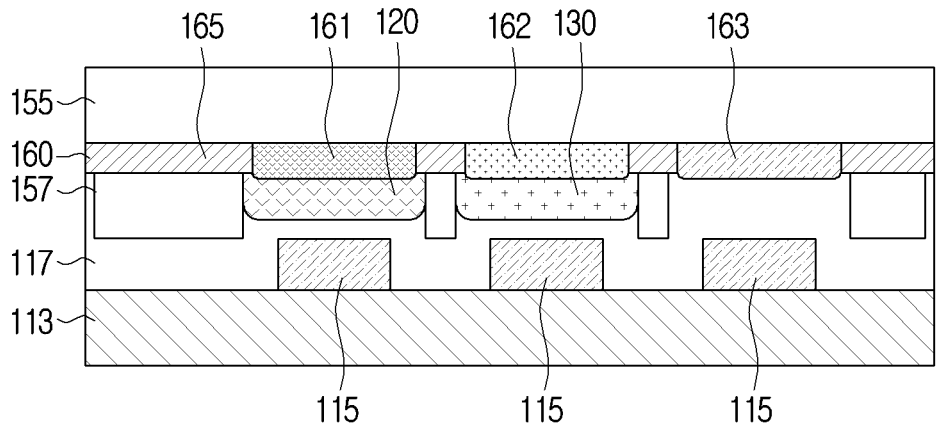
FIG. 5B is a cross-sectional diagram of a display apparatus according to an embodiment of the disclosure.

FIG. 5B is a cross-sectional diagram of a display apparatus 100 according to an embodiment of the disclosure.

Referring to FIG. 5B, the display apparatus 100 may include a color filter layer 160. The color filter layer 160 may include a first light blocking member 165 and first to third color filters 161, 162, and 163. Each of the first to second color filters 161 and 162 may be disposed to face one surface of the first to the second color converters 130, and the third color filter 163 may be disposed to face the third pixel region 10-3, and the first light blocking member 165 may partition the plurality of pixels 10 based on the first to third color filters 163.

The first color filter 161 may be a filter including a color pixel expressing a first color. For example, the first color filter 161 may include a polarizing member to selectively pass light of a predetermined wavelength among incident lights and absorb light having a different wavelength. Similarly, the second color filter 162 may be a filter including a color pixel expressing a second color, and the third color filter 163 may be a filter including a color pixel expressing a third color. The structure of the color filter layer 160 is not limited thereto, and may be implemented in a variety of structures that display colors constituting the pixel 10.

The display apparatus 100 including the color converter layer 110 of the embodiment shown in FIG. 5B is provided with first to second color converters 120 and 130 in one surface direction of the first to second color filters 161 and 162, and the first region 175 of the second light blocking member 152 may support the first to second color converters 120 and 130. Accordingly, the color converter layer 110 which is thicker than the color converter layer 110 composed of only the first light blocking member 151 may be implemented, and the incident light may pass through the multi-layer structure of the color filter layer 160 and the color converters 120 and 130 and change color more vividly, thereby improving the color reproducibility.

Figure 5C:
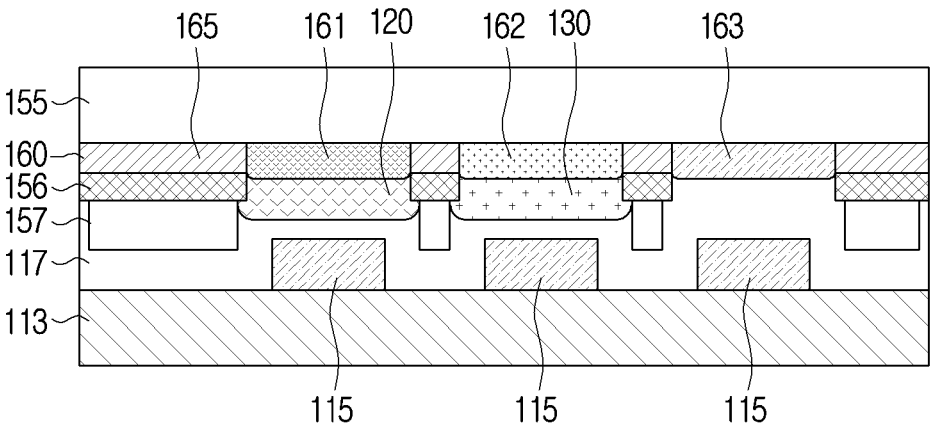
FIG. 5C is a cross-sectional diagram of a display apparatus according to an embodiment of the disclosure.

FIG. 5C is a cross-sectional diagram of a display apparatus 100 according to an embodiment of the disclosure.

Referring to FIG. 5C, the color converter layer 110 may include an intermediate layer 156. The intermediate layer 156 may be provided between the first light blocking member 165 and the second light blocking member 152, and the intermediate layer 156 may be provided between the first light blocking member 165 and the first region 157 of the second light blocking member 152. Although not shown in the drawings, the intermediate layer 156 may be provided between the first light blocking member 151 and the second light blocking member 152 in the embodiment of FIG. 5A that does not include the color filter layer 160.

In the embodiment including the intermediate layer 156, the light blocking member 150 may have a multi-layered structure of three or more layers formed of the first light blocking member 165, the intermediate layer 156, and the second light blocking member 152. The intermediate layer 156 may be formed in a direction of one surface of the first light blocking member 165 in the deposition and patterning process of the light blocking member 150, and the second light blocking member 152 may be deposited and patterned on the intermediate layer 156. The intermediate layer 156 of various embodiments may be formed of a plurality of layers, and in this example, the light blocking member 150 may be implemented to have a multi-layered structure of four or more layers.

The color converter layer 110 including the intermediate layer 156 may form the light blocking member 150 of the multi-layered structure and may adjust thickness and width of each layer.

For example, the intermediate layer 156 may have a thickness equal to or less than the predetermined thickness h2 of the second light blocking member 152. In this example, the intermediate layer 156 may secure a space occupied by the color converters 120 and 130 together with the second light blocking member 152. The intermediate layer 156 of various embodiments may have a thickness equal to or greater than the thickness h1 of the first light blocking member 165.

The intermediate layer 156 may have an area less than or equal to an area of a facing region of the first light blocking member 165. In the intermediate layer 156 of one embodiment, the first region 157 and/or the second region 159 of the second light-blocking member 152 may have an area equal to or less than the area of the facing region of the intermediate layer 156. As the light blocking member 150 is deployed in the direction of the first region 157 of the second light blocking member 152 closest to the light source 115 from the first light blocking member 165 located in the screen display direction according to the multi-layer structure, the width of the cross-sectional area may be reduced. Therefore, the light blocking member 150 has a multi-layer structure and by differently adjusting the cross-sectional area of each layer, the color converter layer 110 may secure a space which the color converters 120 and 130 may occupy, and the color gamut or luminance of the display apparatus 100 may be improved.

Figure 6A:
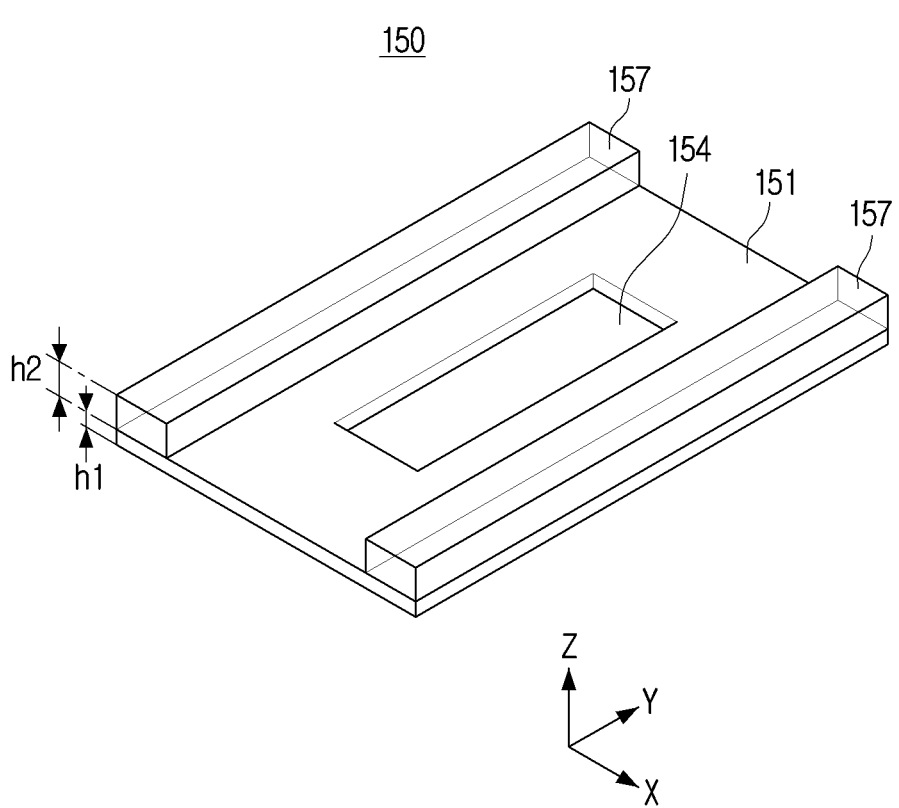
FIG. 6A is a perspective view of a light blocking member according to an embodiment of the disclosure.
Figure 6B:
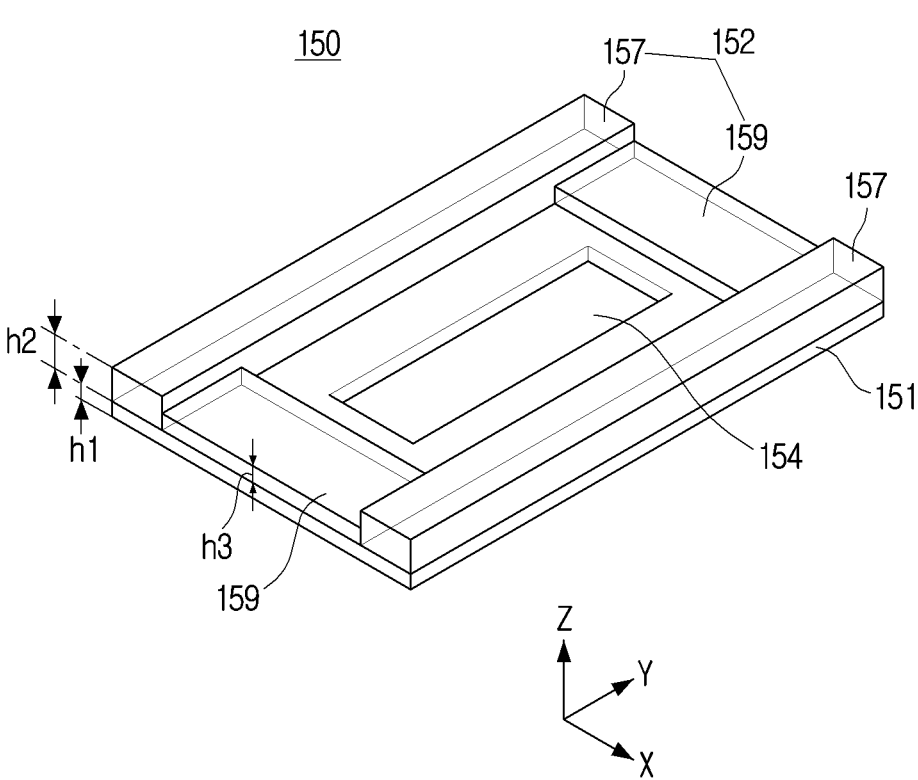
FIG. 6B is a perspective view of a light blocking member according to an embodiment of the disclosure.
Figure 6C:
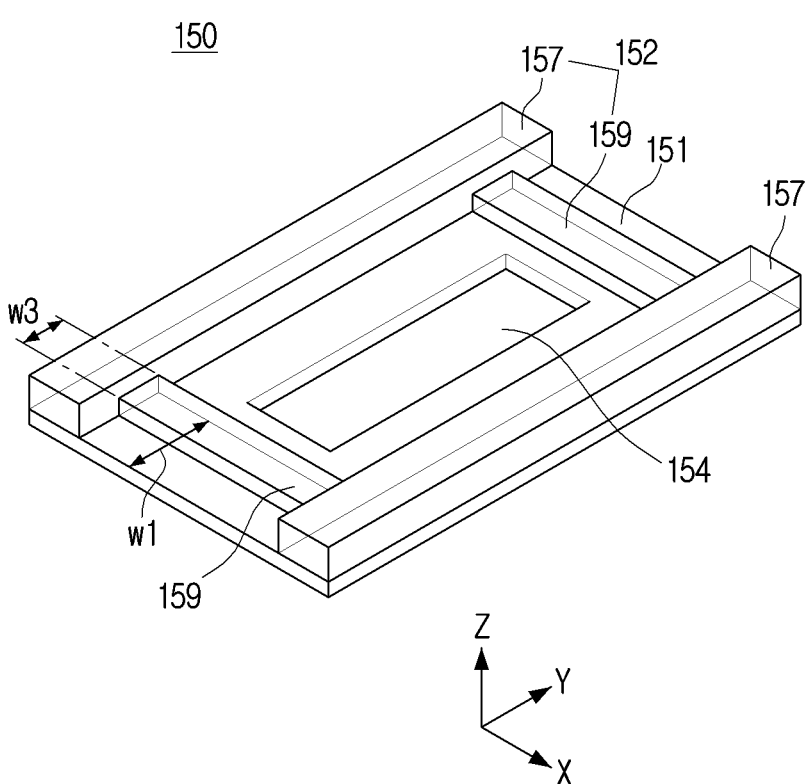
FIG. 6C is a perspective view of a light blocking member according to an embodiment of the disclosure.

FIGS. 6A to 6C are perspective views of a light blocking member 150 according to various embodiments of the disclosure.

Referring to FIGS. 6A to 6C, the color converter layer 110 may include a light blocking member 150 having various structures, and the second light blocking member 152 may further include a first region 157 and a second region 159.

Referring to FIG. 6A, the first region 157 of the second light blocking member 152 according to an embodiment of the disclosure may have thickness h2 greater than thickness h1 of the first light blocking member 151.

The first light blocking member 151 may be made of a material having a color of low brightness, such as black, in consideration of a contrast ratio of the color converter layer 110 because the black matrix is disposed in the display direction of the display apparatus 100. The first light blocking member 151 may have a limit to secure the thickness h1, and for example, the black matrix of the related-art display apparatus 100 may be formed to have a thickness of 1.5 μm due to the characteristic of the material.

The second light blocking member 152 may be disposed inside the display apparatus 100 from the screen display direction of the display, and may be relatively free from the limitation of a material, such as the first light blocking member 151, and may have a thickness h2 greater than the thickness h1 of the first light blocking member 151. For example, the thickness h2 of the first region 157 of the second light blocking member 152 may be formed around 5-20 μm.

At least a portion of the first light blocking member 151 may have an open structure and may include an open region 154 forming a plurality of pixel regions 10-1 to 10-3. In the open region 154 of the first light blocking member 151 in which the color converters 120 and 130 are disposed so that the incident light is converted and passes through the open region 154, and the non-open region of the first light blocking member 151 may block the passage of light to partition and define the plurality of pixel regions 10-1 to 10-3.

The first region 157 of the second light blocking member 152 may have a thickness h2 greater than the thickness h1 of the first light blocking member 151, thereby securing the thickness of the first color converter 120 or the second color converter 130 of the color converter layer 110. The color converters 120 and 130 may be clearly color-converted as the color converters 120 and 130 are thick, for example, the color converters 120 and 130 may include quantum dots 125 and 135. The greater the thickness of the color converters 120 and 130, the more quantum dots may be included. The color converters 120 and 130 may relatively improve the color reproducibility and increase the sharpness of the display apparatus 100 as the thickness of the color converters 120 and 130 is secured.

Since the second light blocking member 152 may easily implement large thickness during manufacturing and selecting a material than the first light blocking member 151, the first region 157, which is at least a portion of the second light blocking member 152, may be formed with a thickness h2 that is greater than the thickness h1 of the first light blocking member 151, thereby securing the thickness of applying the color converters 120 and 130 during the manufacturing process while supporting the color converters 120, 130.

As a result, the color converter layer 110 may include the first region 157 of the second light blocking member 152 extending in the direction of the plurality of light sources 115 to prevent light leakage between the plurality of pixel regions 10-1 to 10-3, and also may support the side portions of the color converters 120 and 130 of the color converter layer 110 to secure the thickness of the color converters 120 and 130 to increase color reproducibility and sharpness.

Referring to FIG. 6B, the second light blocking member 152 may further include a second region 159.

Referring to FIG. 3, the color converter layer 110 may include a plurality of first color converters 120 and a plurality of second color converters 130, and the plurality of first color converters 120 may be spaced apart in a column direction (vertical or Y-axis direction) in a matrix form, and the plurality of second color converters 130 may be arranged to be spaced apart from each other in the column direction of the matrix type adjacent to the plurality of first color converters 120. Although the light blocking member 150 of FIG. 6B is illustrated as one pixel area 10-1 to 10-3 as an example, but in actual implementation, the same type of color converters 120 and 130 may be arranged in plural.

The second region 159 of the second light blocking member 152 may extend from the first light blocking member 151 to the same surface as the first region 157 of the second light blocking member 152, and may be positioned between the plurality of first color converters 120 to block the transmission of incident light. The second region 159 of the second light blocking member 152 may be made of the same material as the first region 157 of the second light blocking member 152, and the second light blocking member 152 of one embodiment may be made of one body.

The thickness h3 of the second region 159 of the second light blocking member 152 of one embodiment may be equal to or less than the thickness h2 of the first region 157 of the second light blocking member 152. This will be described in detail with reference to FIGS. 8A and 8B.

Referring to FIG. 6C, the second region 159 of the second light blocking member 152 may have a smaller area than the area of the first light blocking member 151. The width w3 in the Y direction of the second region 159 of the second light blocking member 152 may be equal to or smaller than the width w1 in the Y-axis direction of the first light blocking member 151. The difference between the widths w1 and w3 may be a difference between the areas of the regions facing each other.

According to various embodiments, with reference to the drawings of FIGS. 4, 5A, and 5B, the second light blocking member 152 may have an area less than or equal to an area of the facing regions of the first light blocking member 151.

The second light blocking member 152 may be disposed on one surface of the first light blocking member 151 and may have a width w3 smaller than the width w1 of the first light blocking member 151. Through this structure, the light blocking member 150 may stably accommodate a larger amount of color converters.

In the light blocking member 150, when the second light blocking member 152 has an area larger than the area of the first light blocking member 151, the light blocking members 152 and 153 are visible in the open region 154 and are not preferred for display quality. In the example of the first light blocking member, the color converters 120, 130 may be visible only in the open region 154, and the amount of the color converters accommodated in each of the plurality of pixel regions 10-1 to 10-3 may decrease.

Referring to FIG. 7, in the process of dispensing the color converters 120 and 130 during the manufacturing process of the color converter layer 110, the area of the dispensing region capable of accommodating the color converters 120 and 130 may be widened, and the color converters 120 and 130 of the liquid state may be more stably dispensed.

The light blocking member 150 according to an embodiment of the disclosure may stably accommodate a larger amount of color converters 120 and 130 by having an area equal to or smaller than the area of the first light blocking member 151 facing the second light blocking member 152.

FIG. 7 is a diagram illustrating a method for manufacturing a color converter layer 110 according to an embodiment of the disclosure.

Referring to FIG. 7, a method of manufacturing the color converter layer 110 may apply a color converter on one surface of the light blocking member 150.

In the converter layer 110 of one embodiment, the first to third color converters 120, 130, and 145 constituting the plurality of pixel regions 10-1 to 10-3 may be spaced apart from each other in a matrix-shaped row direction (the X-axis direction of FIG. 7), and each of the first to third color converters 120, 130, and 145 may be arranged in a column direction (Y-axis direction of FIG. 7) in the form of a matrix. The first to third color converters 120, 130, and 145 may be continuously and linearly applied in the column direction through the dispenser nozzle 50 in the plurality of pixel regions 10-1 to 10-3.

The application method of the first color converter 120 forming the first pixel region 10-1 of the color converter layer 110 may be applied to the application method of the second color converter 130 forming the second pixel region 10-2, the application method of the third color converter 145, or the transmission layer 140 forming the third pixel region 10-3. The application method included in the method of manufacturing the various color converter layers 110 may be variously implemented without being limited thereto.

The dispenser nozzle 50 may apply the first color converter 120 in an electro hydrodynamic (EHD) dispensing manner, or may use an inkjet dispensing method. The EHD dispensing may apply a high voltage to the pump of the dispenser to dispense the solution using the flow of current, charge and control an electric field, such as static electricity at the end of the dispenser nozzle 50, and finely control and dispense the solution.

The dispenser nozzle 50 may be precisely moved in the XYZ direction, and the first color converter 120 may be applied in the column direction of the matrix structure by an EHD dispensing method. The dispenser nozzle 50 may be discontinuously applied by targeting a liquid type color converter member constituting the first color converter 120, for example, QD ink to the open region 154 of the first light blocking region.

The dispenser nozzle 50 may continuously apply a liquid-type color converter member constituting the first color converter 120 linearly in the column direction of the first light blocking member 151.

In this example, the dispenser nozzle 50 may stably apply a fine line width using an EHD dispensing method, and may continue applying, so that the upper surface of the first color converter 120 may be applied at a relatively high speed to form a uniform line width. The liquid-type color converter member, such as QD ink, may be a high-viscosity solution, and may prevent a portion of solution from being splashed to the second pixel region 10-2 or the third pixel region 10-3 of adjacent another column or mixed, thereby improving the stability and efficiency of the application process.

Figure 8A:
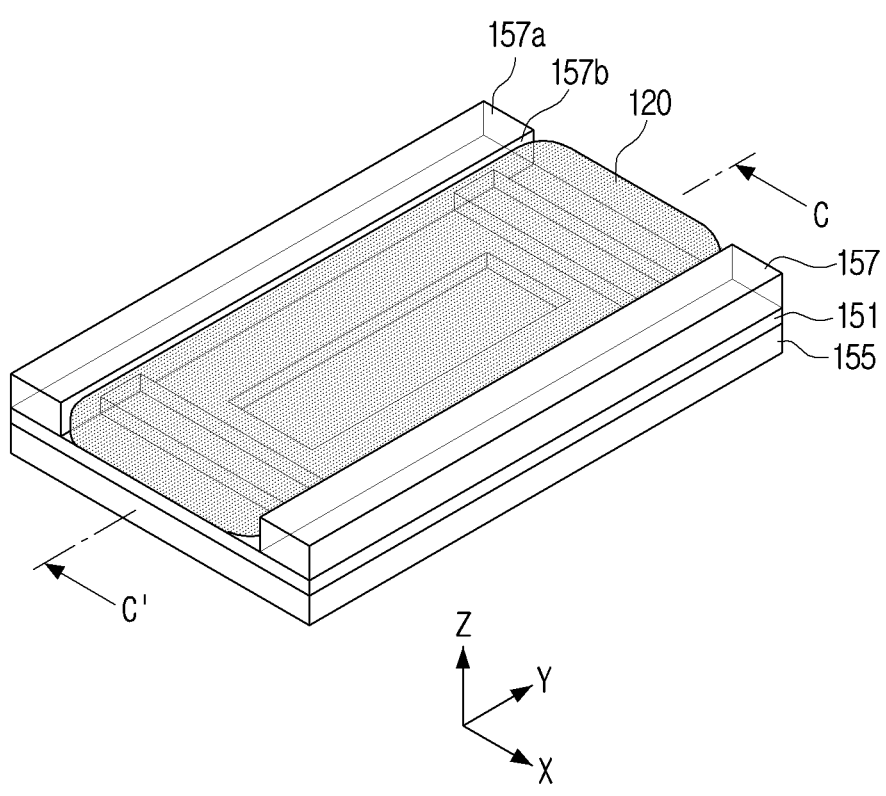
FIG. 8A is a perspective view of a color converter layer according to an embodiment of the disclosure.
Figure 8B:
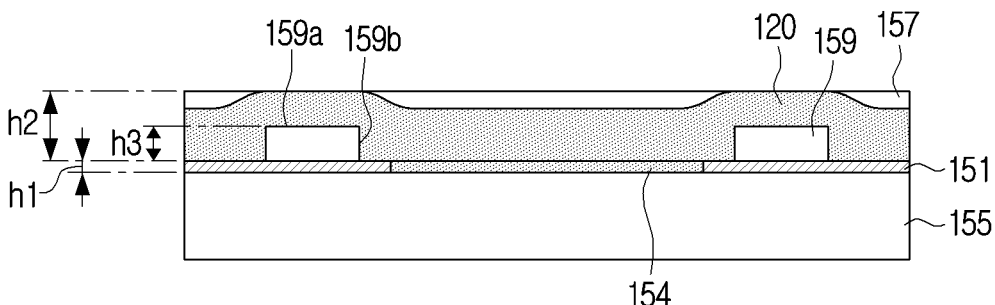
FIG. 8B is a cross-sectional diagram of a color converter layer according to an embodiment of the disclosure.

FIG. 8A is a perspective view of a color converter layer 110 according to an embodiment of the disclosure. FIG. 8B is a cross-sectional diagram of a color converter layer 110 according to an embodiment of the disclosure.

FIG. 8A is a diagram illustrating a state that the first color converter 120 is applied on an upper surface of the light blocking member 150 constituting one pixel region 10-1 to 10-3, and FIG. 8B is a cross-sectional diagram illustrating a cross-section with respect to a cross-sectional line illustrated with C-C' of FIG. 8A.

Referring to FIGS. 8A and 8B, the light blocking member 150 and the first color converter 120, which form the first pixel region 10-1 of the color converter layer 110, are described with respect to the first color converter 120, and this may be equally applied to the second pixel region 10-2 or the third pixel region 10-3.

Referring to FIGS. 8A and 8B, the second region 159 of the second light blocking member 152 may have a thickness h3 that is lower than the thickness h2 of the first region 157 of the second light blocking member 152, and at least a portion of the light blocking member 150 may be made of an ink-phobic material.

The first region 157 of the second light blocking member 152 may have a thickness h2 greater than the thickness h1 of the first light blocking member 151. Referring to the description of FIG. 6A, the total thickness h1+h2 of the first region 157 of the first light blocking member 151 and the second light blocking member 152 may define a thickness of application of the first color converter 120, and the first pixel region 10-1 may be partitioned from adjacent pixel regions 10-1 to 10-3 using the first region 157 of the second light blocking member 152 as a partition wall.

The second region 159 of the second light blocking member 152 may have a thickness h3 that is less than the thickness h2 of the first region 157 of the second light blocking member 152. The second region 159 of the second light blocking member 152 may partition each of the plurality of first pixel regions 10-1, and may prevent light leakage by the light source 115 opposite to the adjacent first pixel region 10-1.

According to various embodiments, when the first color converter 120 of a solution type such as QD ink is applied to the upper surface of the light blocking member 150, a solution of some color converters may remain on the upper surface of the second light blocking member 152. In this example, the second region 159 of the second light blocking member 152 may have a thickness h3 that is smaller than the thickness h2 of the first region 157 of the second light blocking member 152, thereby preventing the solution of the first color converter 120 from entering or splashing to the adjacent second pixel region 10-2 or the third pixel region 10-3. The second region 159 of the second light blocking member 152 may have a thickness h3 that is less than the thickness h2 of the first region 157 of the second light blocking member 152, thereby minimizing the height difference of the upper surface of the color converter layer 110 after the first color converter 120 is applied.

Since the first region 157 of the second light blocking member 152 has a thickness h2 greater than the thickness h3 of the second region 159, the row direction distance of the other pixel regions 10-1 to 10-3 adjacent to between the plurality of first pixel regions 10-1 may be formed nearer than the row direction distance of the adjacent other pixel regions 10-1 to 10-3 and thus, the light blocking member 150 may efficiently prevent light leakage of the display apparatus 100.

The first color converter 120 and the second color converter 130 may be applied on one surface of the light blocking member 150 in a solution type ink, such as QD ink, and at least a part of the light blocking member 150 may be made of an ink-phobic material.

Referring to FIG. 8A, the first region 157 of the second light blocking member 152 may include a plane parallel to one surface of the first light blocking member 151 (i.e., a plane 157*a* parallel to the X-Y plane of FIG. 8A), and a plane 157*b* which is perpendicular to one surface of the first light blocking member 151 (i.e., a plane perpendicular to the X-Y plane of FIG. 8A).

Referring to FIG. 8B, the second region 159 of the second light blocking member 152 may include a plane parallel to one surface of the first light blocking member 151 (i.e., a plane parallel to the X-Y plane of FIG. 8A), and a plane 159*a* which is in parallel with one surface of the first light blocking member 151 (i.e., a plane in parallel with the X-Y plane of FIG. 8A), and a plane perpendicular to one surface of the first light blocking member 151, that is, a plane 159*b* perpendicular to the X-Y plane of FIG. 8A.

The light blocking member 150 may stably apply the first color converter 120 or the second color converter 130 on the pixel regions 10-1 to 10-3 according to the characteristic of the surface, and may implement wetting-control.

A parallel surface 157*a*, 159*a* of the second light blocking member 152 of various embodiments may be ink-phobic. A vertical surface 157*b*, 159*b* of the second light blocking member 152 of various embodiments may be ink-philic.

For example, when the side surfaces 157*b* and 159*b* of the second light blocking member 152 are ink-philic in an example of applying the color converters 120, 130, the color converters 120 and 130 may be stably applied to the inside of the space where the side surfaces 157*b* and 159*b* of the second light blocking member 152 are formed and the open region 154 constituting each of the plurality of pixel regions 10-1 to 10-2.

When the light blocking member 150 has insufficient wetting with respect to the ink, the first color converter 120 may not be applied with a uniform thickness, causing light leakage, and the vertical surfaces 157*b* and 159*b* of the second light blocking member 152 are ink-philic so that the first color converter 120 may be stably applied to the inside of the first pixel region 10-1.

When the parallel surfaces 157*a* and 159*a* of the second light blocking member 152 have an ink-phobic feature, the parallel surface 157*a* of the first region 157 may prevent each of the color converters 120 and 130 from flowing into another pixel region adjacent to the target region, and the parallel surface 159*a* of the second region 159 may push the color converters 120 and 130 to uniformly form the height of the upper surface forming the color converters 120 and 130 within the same pixel region.

The parallel surfaces 157*a* and 159*a* of the second light blocking member 152 may have an ink-phobic feature, so that the first color converter 120 may be prevented from overflowing or splashing to the upper surface of the first pixel region 10-1 or some of the other pixel regions 10-1 to 10-3 are not mixed during the application process.

When the transparent substrate 155 is made of an ink-philic material such as glass in various embodiments, the color converters 120 and 130 may be stably applied even if both the upper surface and the side surface of the second light blocking member 152 are ink-phobic.

Figure 9A:
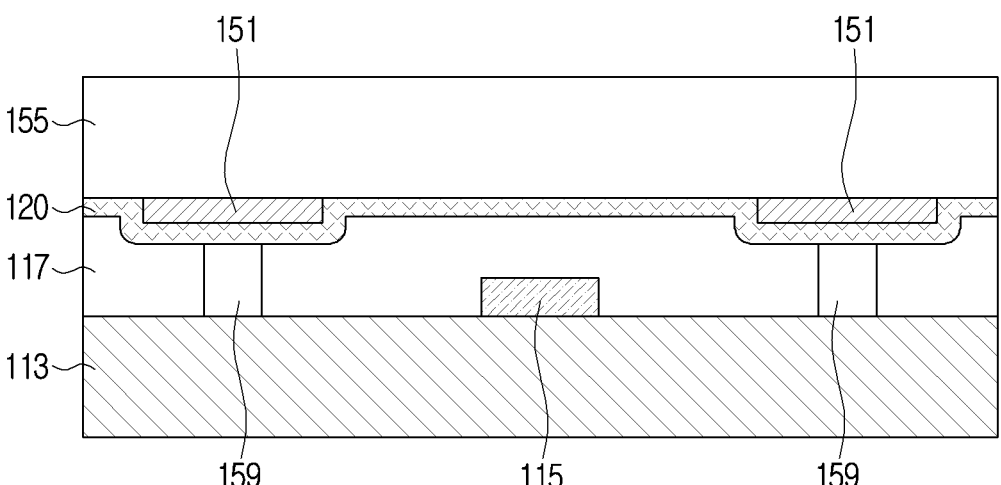
FIG. 9A is a cross-sectional diagram of a display apparatus according to an embodiment of the disclosure.
Figure 9B:
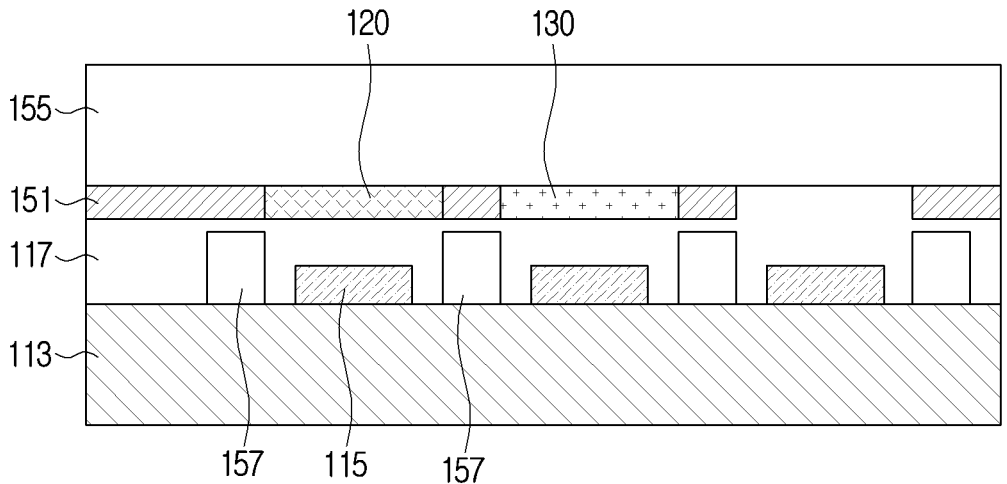
FIG. 9B is a cross-sectional diagram of a display apparatus according to an embodiment of the disclosure.

FIG. 9A is a cross-sectional diagram of a display apparatus 100 according to an embodiment of the disclosure. FIG. 9B is a cross-sectional diagram of a display apparatus 100 according to an embodiment of the disclosure. FIG. 9A is a cross-sectional diagram with respect to the cross-sectional line illustrated with A-A' of FIG. 3, and FIG. 9B is a cross-sectional diagram with respect to the cross-sectional line illustrated with B-B' of FIG. 3.

Referring to FIG. 9A, the second region 159 of the second light blocking member 152 of various embodiments may be spaced apart from one surface of the first light blocking member 151, and referring to FIG. 9B, the first region 157 of the second light blocking member 152 of various embodiments may be spaced apart from one surface of the first light blocking member 151 and disposed.

The second light blocking member 152 may be spaced apart from the first light blocking member 151 and may surround each of the plurality of light sources 115 arranged in a matrix form, and the light blocking member 150 of this structure may effectively block light leakage of the plurality of light sources 115.

According to an embodiment in which the second light blocking member 152 is spaced apart from the first light blocking member 151, in a method of manufacturing the display apparatus 100, the light blocking member 150 may be formed on the base substrate 113 to form the second light blocking member 152, and then the plurality of light sources 115 and the adhesive layer 117 may be formed. An adhesive layer 117 may be formed between the second light blocking member 152 and the first light blocking member 151.

Figure 10A:
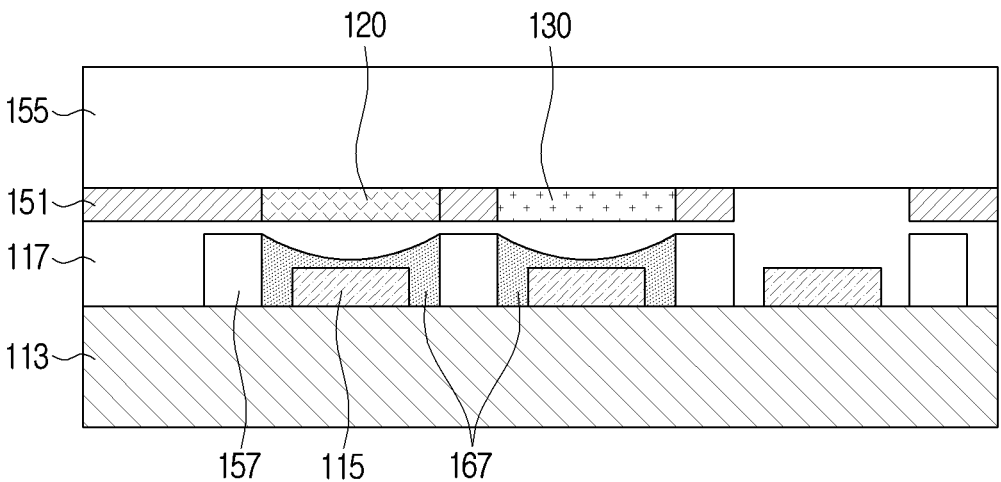
FIG. 10A is a cross-sectional diagram of a display apparatus according to an embodiment of the disclosure.
Figure 10B:
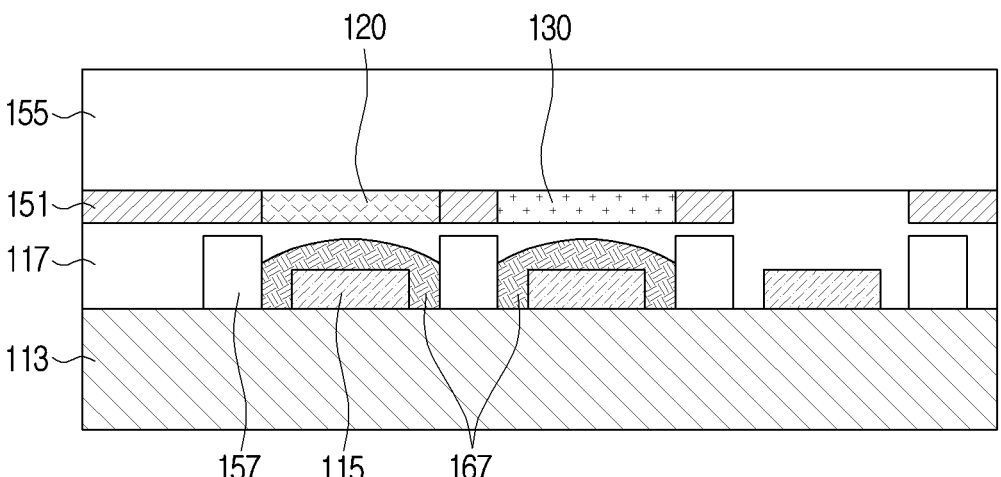
FIG. 10B is a cross-sectional diagram of a display apparatus according to an embodiment of the disclosure.
Figure 10C:
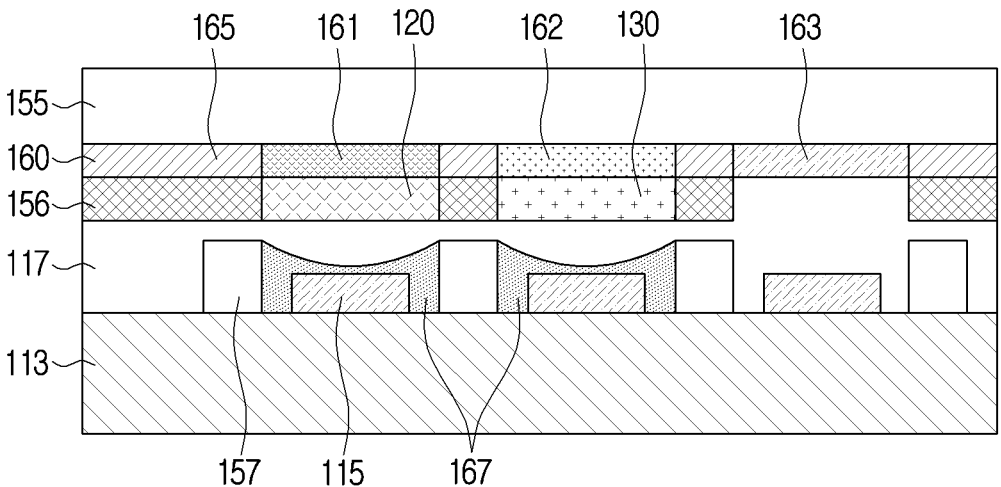
FIG. 10C is a cross-sectional diagram of a display apparatus according to an embodiment of the disclosure.
Figure 10D:
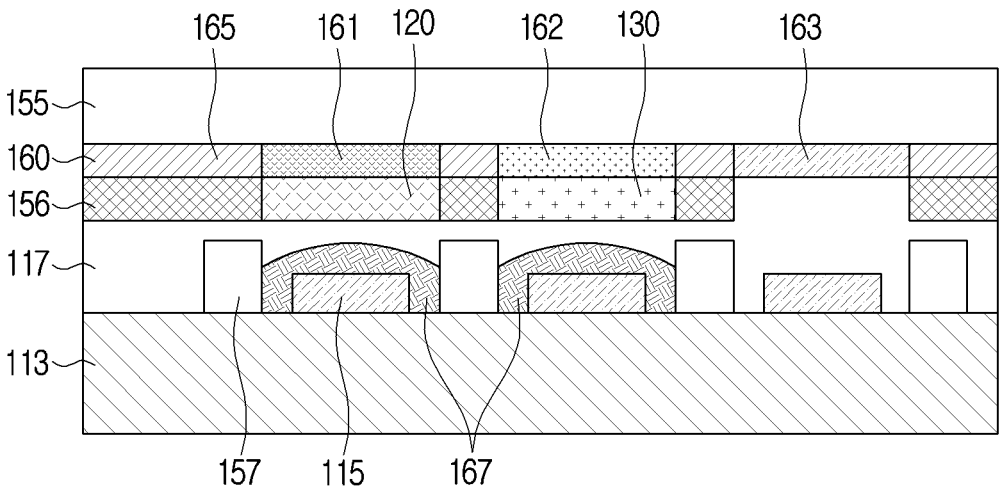
FIG. 10D is a cross-sectional diagram of a display apparatus according to an embodiment of the disclosure.

FIG. 10A is a cross-sectional diagram of a display apparatus 100 according to an embodiment of the disclosure. FIG. 10B is a cross-sectional diagram of a display apparatus 100 according to an embodiment of the disclosure. FIG. 10C is a cross-sectional diagram of a display apparatus according to an embodiment of the disclosure. FIG. 10D is a cross-sectional diagram of a display apparatus according to an embodiment of the disclosure.

Referring to FIGS. 10A to 10D, the color converter layer 110 may include an optical resin 167. The optical resin 167 may be implemented with the second light blocking member 152 and may be disposed inside the plurality of pixel regions 10-1 to 10-3, and may have a structure in which at least a portion thereof is curved in the direction of the first light blocking member 151, and may surround each of the plurality of light sources 115. The first region 157 and the second region 159 of the second light blocking member 152 may support a lateral portion in a row direction and a column direction of the optical resin 167.

The optical resin 167 may surround each of the plurality of light sources 115 with a structure in which an upper surface is curved, and may guide incident light emitted from the plurality of light sources 115 in the direction of the first color converter 120 or the second color converter 130, preferably in the central direction, thereby increasing the luminous efficiency of the color converter layer 110.

An adhesive layer 117 may be provided on an upper surface of the optical resin 167, and the first color converter 120 or the second color converter 130 may be disposed on the adhesive layer 117. In this example, in consideration of the large or small relationship of the refractive index between the optical resin 167 and the adhesive layer 117, the optical resin 167 may have an upwardly concave structure or an upwardly convex structure, and the optical resin 167 may collect the incident light in the direction of the first color converter 120 or the second color converter 130.

For example, referring to FIG. 10A, when the refractive index of the optical resin 167 is less than the refractive index of the adhesive layer 117, the optical resin 167 may have a structure in which an upper surface is concave. The optical resin 167 may serve as a concave lens so that incident light is transmitted to the adhesive layer 117 via the optical lens and is gathered in the central portion of the optical resin 167. Alternatively, referring to FIG. 10B, when the refractive index of the optical resin 167 is greater than the refractive index of the adhesive layer 117, the optical resin 167 may have a structure in which the upper surface is convex. The optical resin 167 may serve as a convex lens so that incident light is transmitted to the adhesive layer 117 via the optical lens and collected in the central portion.

Referring to FIGS. 10C and 10D, the color converter layer 110 may include the color filter layer 160.

The intermediate layer 156 may be formed in one surface direction of the first light blocking member 165 that partitions between the plurality of color filters 161, 162, and 163 of the color filter layer 160, and the second light blocking member 152 may be formed on the other surface of the intermediate layer 156.

Referring to FIG. 5C, the intermediate layer 156 may be formed on one surface of the first light blocking member 151 that does not include the color filter layer 160, and the intermediate layer 156 may secure the thickness of the color converter layer 110 through the multi-layer structure, thereby improving the color gamut and the contrast ratio of the color converter layer 110.

Figure 11:
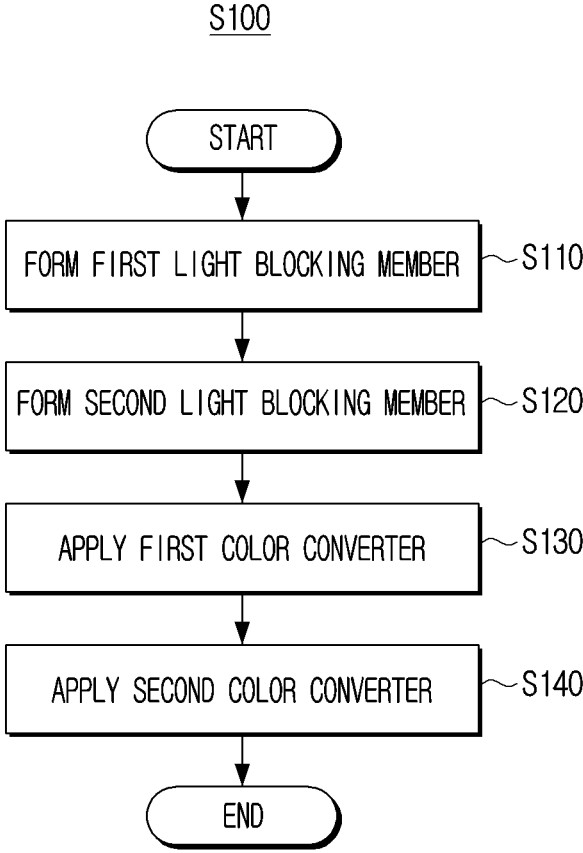
FIG. 11 is a flowchart illustrating a method for manufacturing a color converter layer according to an embodiment of the disclosure.

FIG. 11 is a flowchart illustrating a method for manufacturing a color converter layer 110 in operation S100 according to an embodiment of the disclosure.

Referring to FIG. 11, in describing the method for manufacturing the color converter layer 110 below, a portion overlapping the above description with respect to the elements constituting the color converter layer 110 will be omitted or abbreviated.

Referring to FIG. 11, the first light blocking member 151 defining a plurality of pixel regions 10-1 to 10-3 may be patterned and formed on a substrate in operation S110. The substrate may be a transparent substrate 155 or a glass substrate constituting the display panel 103, or may be a separately manufactured substrate. The first light blocking member 151 may be patterned such that the plurality of open regions 154 are spaced apart from each other in the form of a matrix, and the first light blocking member 151 may have a black matrix so that light may be shielded, and may be implemented as a black matrix.

On an upper surface of the first light blocking member 151, the second light blocking member 152 may be patterned and formed to extend with a predetermined thickness h2 greater than thickness h1 of the first light blocking member 151, and partition a column direction of the plurality of pixel regions 10-1 to 10-3 in operation S120. The second light blocking member 152 may be formed of a material that blocks light from transmitting, such as whitish reflecting light, blackish that may absorb light, or grayish with a mixture of black material, or may be made of metal material to reflect light.

In the operation S120 of forming the second light blocking member 152, patterning may be performed so that the first region 157 for partitioning the column direction of the plurality of pixel regions 10-1 to 10-3 and the second region 159 for partitioning the row direction of the plurality of pixel regions 10-1 to 10-3 are formed. The second light blocking member 152 may be formed of one body, and the second light blocking member 152 is patterned after the one light blocking member 150 is deposited, and the second light blocking member 152 is formed to divide the plurality of pixel regions 10-1 to 10-3 in the row direction and the column direction.

In operation S120 of forming the second light blocking member 152, the first region 157 of the second light blocking member 152 may be patterned to have a thickness h2 greater than the thickness h3 of the second region 159 of the second light blocking member 152. The second region 159 of the second light blocking member 152 may be patterned to have an area equal to or smaller than the area of the first light blocking member 151.

In the method of manufacturing in operation S100, when the second light blocking member 152 is primarily patterned to correspond to the thickness of the second region 159 of the second light blocking member 152, the light blocking member 150 may be deposited again for secondary patterning to correspond to the thickness of the first region 157 of the second light blocking member 152.

In the manufacturing method in operation S100 a light blocking member 150 having a thickness greater than or equal to a thickness of the first region 157 of the second light blocking member 152 is deposited to be first patterned according to the thickness of the first region 157 of the second light blocking member 152, and then secondarily patterned according to the thickness of the second region 159 of the second light blocking member 152. In addition, the patterning method of the first to the second light blocking members 153 may be variously implemented in the manufacturing method S100.

In operation S120 of forming the second light blocking member 152, the wetting control process prior to applying the first color converter 120 and the second color converter 130 in operations S130 and S140 may be included. Referring to FIGS. 8A and 8B, the wetting control of the light blocking member 150 may have an entire surface which is ink-phobic, and the parallel surfaces 152a and 153a may be coated to have an ink-phobic property, or the vertical surfaces 152b and 153b of the second light blocking member 152 may have an ink-philic property.

According to an embodiment of the disclosure, the first light blocking member 151 and the second light blocking member 152 may be made of the same material. In this example, the light blocking member 150 may be formed by coating, depositing, or applying the light blocking member 150 on the upper surface of the first light blocking member 151, or patterning the light blocking member 150 made of one body to form the first light blocking member 151 and the second light blocking member 152.

The first color converter 120 may be applied between the second light blocking members 152 in the column direction of the plurality of pixel regions 10-1 to 10-3 in operation S130, and the second color converter 130 may be sequentially applied in adjacent to the first color converter 120 in the column direction of the plurality of pixel regions 10-1 to 10-3 in operation S140. Although not shown in the drawings, a third color converter 145 or a transparent layer may be applied adjacent to the first color converter 120 or the second color converter 130 in the column direction of the plurality of pixel regions 10-1 to 10-3.

The method of applying the first color converter 120 or the second color converter 130 may use a method of controlling the electric field of the dispenser nozzle 50 as described above in the description of FIGS. 7, 8A, and 8B, and may use an electro-hydrodynamic dispensing method, and may continuously apply the first color converter 120 or the second color converter 130 in a matrix column direction.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A color converter layer comprising:
a first light blocking member in which a plurality of pixel regions comprising a first pixel region and a second pixel region are disposed to be spaced apart from each other;
a first color converter disposed in the first pixel region and configured to convert incident light into a first color and emit the incident light in the first color;
a second color converter disposed in the second pixel region and configured to:
convert the incident light into a second color that is different from the first color, and
emit the incident light in the second color; and
a second light blocking member that extends with a preset thickness and is formed on a surface of the first light blocking member, and is configured to block transmission of the incident light into an adjacent pixel region by partitioning the first pixel region and the second pixel region,
wherein the preset thickness of the second light blocking member is greater than a thickness of the first light blocking member,
wherein the second light blocking member comprises a first region and a second region,
wherein the first region and the second region are configured to support a lateral portion in a row direction and a column direction of optical resin,
wherein the first region is thicker than the second region in a direction extending downward toward the first light blocking member, and
wherein the optical resin surrounds each of a plurality of light sources with a structure in which an upper surface is curved and configured to guide incident light emitted from the plurality of light sources in a direction of the first color converter or the second color converter.

2. The color converter layer of claim 1, wherein the plurality of pixel regions comprise:

a plurality of first pixel regions being arranged in a column direction in a matrix structure; and
a second pixel region being arranged in a column direction adjacent to a row direction of the plurality of first pixel regions.

3. The color converter layer of claim 2,
wherein the first region configured to partition the plurality of pixel regions in a column direction of the matrix structure; and
wherein the second region configured to partition the plurality of pixel regions in a row direction of the matrix structure,
wherein the first region has the preset thickness.

4. The color converter layer of claim 3, wherein the second region of the second light blocking member has a thickness less than or equal to the preset thickness of the first region.

5. The color converter layer of claim 3, wherein the first region of the second light blocking member has an area less than or equal to a facing area of the first light blocking member.

6. The color converter layer of claim 3, wherein the second region of the second light blocking member has an area less than or equal to a facing area of the first light blocking member.

7. The color converter layer of claim 1, wherein at least a part of an area of a surface of the second light blocking member that is parallel to the surface of the first light blocking member is ink-phobic.

8. The color converter layer of claim 1, comprising:
an intermediate layer provided between the first light blocking member and the second light blocking member,
wherein the intermediate layer has a thickness less than or equal to the preset thickness of the second light blocking member.

9. The color converter layer of claim 8,
wherein the intermediate layer has an area less than or equal to an area of a facing region of the first light blocking member, and
wherein the second light blocking member has an area less than or equal to an area of a facing region of the intermediate layer.

10. The color converter layer of claim 8, wherein the intermediate layer is formed of a plurality of layers.

11. The color converter layer of claim 1,
wherein the second light blocking member is disposed to be spaced apart from the surface of the first light blocking member, and
wherein the second light blocking member comprises an adhesive layer filling between the first light blocking member and the second light blocking member.

12. The color converter layer of claim 1, wherein the optical resin disposed on the first pixel region partitioned by the second light blocking member and at least a part is curved in the direction of the first light blocking member.

13. The color converter layer of claim 1, wherein the first light blocking member comprises:
a third pixel region disposed to be spaced apart from the first pixel region and the second pixel region; and
a transmission layer disposed on the third pixel region to transmit the incident light.

14. A method of manufacturing a color converter layer, the method comprising:
patterning and forming, on a substrate, a first light blocking member that defines a plurality of pixel regions in a matrix format;

patterning and forming a second light blocking member that extends with a preset thickness greater than a thickness of the first light blocking member on a surface of the first light blocking member and partitions a column direction of the plurality of pixel regions;

applying a first color converter that converts incident light into a first color between the second light blocking members in a column direction of the plurality of pixel regions; and applying a second color converter that converts the incident light into a second color that is different from the first color to be adjacent with the first color converter, in a column direction of the plurality of pixel regions, wherein the second light blocking member comprises a first region and a second region, wherein the first region and the second region are configured to support a lateral portion in a row direction and a column direction of optical resin, wherein the first region is thicker than the second region in a direction extending downward toward the first light blocking member, and wherein the optical resin surrounds each of a plurality of light sources with a structure in which an upper surface is curved and configured to guide incident light emitted from the plurality of light sources in the direction of the first color converter or the second color converter.

15. The method of claim 14, wherein the applying of the first color converter comprises controlling an electronic field of a dispenser nozzle and applying the first color converter in a dispensing manner.

16. The method of claim 15, wherein the controlling of the electronic field comprises applying a high voltage to a pump of the dispenser nozzle so as to apply the first color converter based on a flow of current or charge of the electronic field.

17. The method of claim 14, wherein the substrate is part of display panel of an electronic device.

18. The method of claim 14, further comprising performing a wetting control process prior to applying the first color converter.

19. The color converter layer of claim 1, wherein the second light blocking member has an area equal to or smaller than the area of the first light blocking member.

* * * * *